United States Patent
Kannan et al.

(10) Patent No.: US 10,658,363 B2
(45) Date of Patent: May 19, 2020

(54) CUT INSIDE REPLACEMENT METAL GATE TRENCH TO MITIGATE N-P PROXIMITY EFFECT

(71) Applicant: GLOBALFOUNDRIES INC., Grand Cayman (KY)

(72) Inventors: Balaji Kannan, Clifton Park, NY (US); Ayse M. Ozbek, Malta, NY (US); Tao Chu, Portland, OR (US); Bala Haran, Watervliet, NY (US); Vishal Chhabra, Clifton Park, NY (US); Katsunori Onishi, Somers, NY (US); Guowei Xu, Ballston Lake, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 16/562,481

(22) Filed: Sep. 6, 2019

(65) Prior Publication Data
US 2019/0393221 A1 Dec. 26, 2019

Related U.S. Application Data

(62) Division of application No. 15/783,549, filed on Oct. 13, 2017, now Pat. No. 10,446,550.

(51) Int. Cl.
*H01L 27/092* (2006.01)
*H01L 29/06* (2006.01)
(Continued)

(52) U.S. Cl.
CPC ...... *H01L 27/0924* (2013.01); *H01L 21/0274* (2013.01); *H01L 21/31111* (2013.01);
(Continued)

(58) Field of Classification Search
CPC ......... H01L 27/0924; H01L 21/823828; H01L 21/823878; H01L 21/0274; H01L 21/31111; H01L 21/31144; H01L 21/823431; H01L 21/823437; H01L 21/823481; H01L 27/0207; H01L 29/0649; H01L 29/66545; H01L 27/1104; H01L 29/517; H01L 21/823821
See application file for complete search history.

(56) References Cited

U.S. PATENT DOCUMENTS

| | | | |
|---|---|---|---|
| 6,854,330 B2 * | 2/2005 | Potter | G01P 15/125 310/309 |
| 7,059,190 B2 * | 6/2006 | Sakai | G01P 15/0802 361/280 |

(Continued)

*Primary Examiner* — Edward Chin
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to a cut inside a replacement metal gate trench to mitigate n-p proximity effects and methods of manufacture. The structure described herein includes: a first device; a second device, adjacent to the first device; a dielectric material, of the first device and the second device, including a cut within a trench between the first device and the second device; and a common gate electrode shared with the first device and the second device, the common gate electrode provided over the dielectric material and contacting underlying material within the cut.

15 Claims, 2 Drawing Sheets

(51) Int. Cl.
*H01L 27/02* (2006.01)
*H01L 21/311* (2006.01)
*H01L 29/66* (2006.01)
*H01L 21/8234* (2006.01)
*H01L 21/027* (2006.01)
*H01L 21/8238* (2006.01)
*H01L 29/51* (2006.01)
*H01L 27/11* (2006.01)

(52) U.S. Cl.
CPC ............ *H01L 21/31144* (2013.01); *H01L 21/823431* (2013.01); *H01L 21/823437* (2013.01); *H01L 21/823481* (2013.01); *H01L 21/823828* (2013.01); *H01L 21/823878* (2013.01); *H01L 27/0207* (2013.01); *H01L 29/0649* (2013.01); *H01L 29/66545* (2013.01); *H01L 27/1104* (2013.01); *H01L 29/517* (2013.01)

(56) References Cited

U.S. PATENT DOCUMENTS

| | | | | |
|---|---|---|---|---|
| 7,180,019 | B1 * | 2/2007 | Chiou | G01P 15/0891 200/61.45 M |
| 7,449,355 | B2 * | 11/2008 | Lutz | B81B 3/0005 438/50 |
| 7,514,760 | B1 * | 4/2009 | Quevy | B81C 1/00246 257/414 |
| 7,736,931 | B1 * | 6/2010 | Guo | G01P 15/0802 257/E21.613 |
| 8,021,939 | B2 | 9/2011 | Chudzik et al. | |
| 8,098,870 | B2 * | 1/2012 | Kok | B81B 3/001 257/419 |
| 8,581,349 | B1 * | 11/2013 | Sekar | H01L 29/78696 257/402 |
| 8,587,077 | B2 * | 11/2013 | Chen | B81C 1/00238 257/254 |
| 8,692,337 | B2 * | 4/2014 | Berthelot | B81C 1/00015 257/415 |
| 8,895,381 | B1 * | 11/2014 | Cheng | H01L 21/84 257/E21.409 |
| 9,093,495 | B2 | 7/2015 | Baiocco et al. | |
| 9,263,446 | B1 | 2/2016 | Xie et al. | |
| 9,496,271 | B2 * | 11/2016 | Or-Bach | G11C 16/02 |
| 9,725,310 | B2 * | 8/2017 | Cheng | B81C 1/00246 |
| 10,090,306 | B2 * | 10/2018 | Li | H01L 21/823842 |
| 2004/0152279 | A1 * | 8/2004 | Madurawe | G11C 11/412 438/400 |
| 2004/0245586 | A1 * | 12/2004 | Partridge | B81C 1/00301 257/414 |
| 2006/0163679 | A1 * | 7/2006 | LaFond | G01C 19/5719 257/414 |
| 2007/0158767 | A1 * | 7/2007 | Sinclair | B81B 3/004 257/415 |
| 2008/0076244 | A1 * | 3/2008 | Ye | H01L 21/31144 438/597 |
| 2008/0119000 | A1 * | 5/2008 | Yeh | B81C 1/00246 438/50 |
| 2010/0005884 | A1 * | 1/2010 | Weinberg | G01C 19/5719 73/504.15 |
| 2010/0006972 | A1 * | 1/2010 | La Tulipe, Jr. | H01L 21/02002 257/499 |
| 2010/0148341 | A1 * | 6/2010 | Fuji | B81B 7/007 257/686 |
| 2010/0149625 | A1 * | 6/2010 | Lu | B81C 1/00238 359/291 |
| 2010/0171153 | A1 * | 7/2010 | Yang | B81C 1/00246 257/254 |
| 2010/0176466 | A1 * | 7/2010 | Fujii | B81B 7/007 257/415 |
| 2010/0240215 | A1 * | 9/2010 | Huang | B81C 1/0015 438/669 |
| 2010/0251818 | A1 * | 10/2010 | Ge | G01C 19/5684 73/504.12 |
| 2011/0037160 | A1 * | 2/2011 | Hsu | B81C 1/00246 257/690 |
| 2011/0272796 | A1 * | 11/2011 | Eaton | H01L 23/055 257/682 |
| 2012/0119311 | A1 * | 5/2012 | Akhlaghi Esfahany | B81C 1/00301 257/415 |
| 2013/0241008 | A1 * | 9/2013 | Choi | H01L 29/4958 257/410 |
| 2014/0042562 | A1 * | 2/2014 | Chu | B81B 3/0059 257/415 |
| 2014/0261960 | A1 * | 9/2014 | Lin | H01L 21/02 156/64 |
| 2015/0064897 | A1 * | 3/2015 | Baiocco | H01L 21/0332 438/595 |
| 2015/0097238 | A1 * | 4/2015 | Zhang | H01L 29/6659 257/347 |
| 2015/0206953 | A1 * | 7/2015 | Basker | H01L 29/66795 257/192 |
| 2016/0190303 | A1 * | 6/2016 | Liu | H01L 29/66795 257/192 |
| 2016/0358826 | A1 * | 12/2016 | Niimi | H01L 21/82387 |
| 2017/0236759 | A1 * | 8/2017 | Jagannathan | H01L 21/845 257/392 |
| 2018/0240873 | A1 * | 8/2018 | Cheng | H01L 29/0847 |

* cited by examiner

US 10,658,363 B2

CUT INSIDE REPLACEMENT METAL GATE TRENCH TO MITIGATE N-P PROXIMITY EFFECT

FIELD OF THE INVENTION

The present disclosure relates to semiconductor structures and, more particularly, to a cut inside a replacement metal gate trench to mitigate n-p proximity effects and methods of manufacture.

BACKGROUND

Integrated circuits include many different devices, e.g., NFETs, PFETs, etc. integrated into a single chip or die. These integrated circuits can include, e.g., CMOS inverters, SRAM devices, etc. In CMOS inverters as in SRAM shared-gate devices, the NFETs and PFETs share a common gate-dielectric material, in addition to a common gate electrode. The workfunction metals, though, for a PFET and NFET may be different.

As the N-P boundary moves towards one or the other device, Vt dramatically increases at ground-rule proximities. For example, at about 30 nm distance of N-P boundary from the gate edges, the N-P local layout effect can account for approximately 30 mV of Vt increase (vs. isolated devices). This increase can be attributed to oxygen diffusion from the PFET side of the gate stack to the NFET side of the gate stack. The oxygen diffusion has a pathway with the common gate-dielectric material between the adjacent devices. That is, the common gate-dielectric material between the adjacent devices will act as a conduit for the oxygen transport from the PFET to the NFET.

SUMMARY

In an aspect of the disclosure, a structure comprises: a first device; a second device, adjacent to the first device; a dielectric material, of the first device and the second device, including a cut within a trench between the first device and the second device; and a common gate electrode shared with the first device and the second device, the common gate electrode provided over the dielectric material and contacting underlying material within the cut.

In an aspect of the disclosure, a structure comprises: an NFET device; a PFET device, adjacent to the NFET device; a discontinuous gate dielectric material for the NFET device and the PFET device; and a common gate electrode shared with the PFET device and the NFET device.

In an aspect of the disclosure, a method comprises: forming a common dielectric material over a first device area and a second device area; cutting the common dielectric material within a gate trench between the first device area and the second device area to separate the common dielectric material into a first dielectric material over the first device area and a second dielectric material over the second device area; forming a workfunction metal over the first dielectric material in the first device area; and forming a common electrode over the workfunction metal of the first device area and the second dielectric material over the second device area to form a first device in the first device area and a second device in the second device area, respectively.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a cut inside a replacement metal gate trench to mitigate n-p proximity effects and methods of manufacture. In more specific embodiments, the cut inside the replacement metal gate trench will remove gate dielectric material between shared gates, e.g., NFETs and PFETs. In this way, the oxygen transport conduit between the shared gates, e.g., NFETs and PFETs, will be broken (or eliminated), preserving the Vt of the NFET (e.g., will not result in an increase in pVt) and enabling scaled thickness of the workfunction metal and improved Vt control.

The methods described herein include cutting a high-k dielectric layer inside a replacement metal gate trench to mitigate N-P proximity effects. The method includes, for example, depositing a high-k dielectric layer and a sacrificial cap layer over NFETs and PFETs structures with gates, patterning to open regions between NFETs and PFETs inside the gates, and etching a portion of the sacrificial cap layer and the high-k dielectric layer selectively to form a cut in the high-k dielectric layer. The sacrificial layer can then be removed, followed by depositing and patterning a workfunction metal layer on the high-k dielectric layer.

In embodiments, the fabrication processes described herein employ patterning techniques that can be easily integrated into replacement metal gate fabrication flows; that is, the methodologies, i.e., technologies, employed to manufacture the structures of the present disclosure have been adopted from integrated circuit (IC) technology. For example, the structures of the present disclosure can be manufactured in a number of ways using a number of different tools. In general, though, the methodologies and tools are used to form structures with dimensions in the micrometer and nanometer scale. For example, the structures are built on wafers and are realized in films of material patterned by photolithographic processes on the top of a wafer. In particular, the fabrication of the structures, e.g., cuts, uses three basic building blocks: (i) deposition of thin films of material on a substrate, (ii) applying a patterned mask on top of the films by photolithographic imaging, and (iii) etching the films selectively to the mask.

Figure 1:
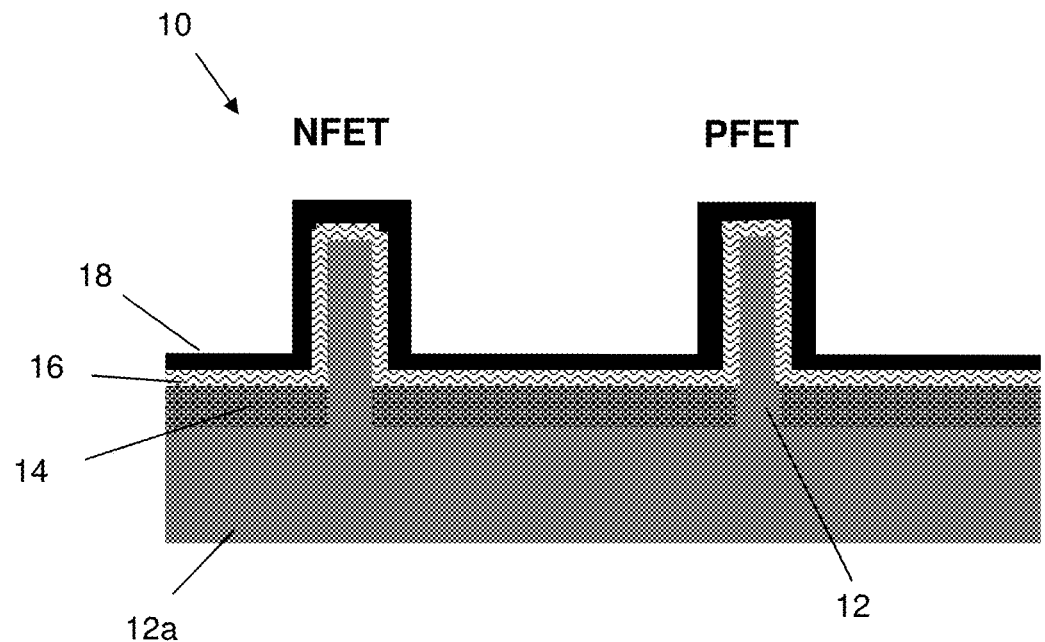
FIG. 1 shows a structure with a shared gate dielectric material between fin structures, amongst other features, and respective fabrication processes in accordance with aspects of the present disclosure.

FIG. 1 shows a structure with a shared gate dielectric material between adjacent fin structures, amongst other features, and respective fabrication processes in accordance with aspects of the present disclosure. In particular, the structure 10 of FIG. 1 includes a plurality of fin structures 12 formed from a substrate 12a. In embodiments, the substrate 12a may be composed of any suitable material including, but not limited to, Si, SiGe, SiGeC, SiC, GaAs, InAs, InP, and other III/V or II/VI compound semiconductors. Insulator material 14 is provided between the fin structures 12 to provide isolation between subsequently formed gate structures. In embodiments, the insulator material 14 can be, e.g., oxide material, deposited by conventional deposition process, e.g., chemical vapor deposition (CVD) process.

In embodiments, the fin structures 12 can be formed by a sidewall imaging technique (SIT), known to those of skill in the art. In an example of a SIT technique, a mandrel material, e.g., $SiO_2$, is deposited on the substrate 12a using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions of the fin structures 12. Spacers are formed on the sidewalls of the mandrels which are preferably material that is different than the mandrels, and which are formed using conventional deposition processes known to those of skill in the art. The spacers can have a width which matches the dimensions of the narrow fin structures 12, for example. The mandrels are removed or stripped using a conventional etching process, selective to the mandrel material. An etching is then performed within the spacing of the spacers to form the sub-lithographic features. The sidewall spacers can then be stripped. The fin structures 12 can have a pitch of 30 nm or less, depending on the technology node.

Still referring to FIG. 1, a dielectric material 16 is deposited on the substrate 12a and fin structures 12. In embodiments, the dielectric material 16 will be a shared gate dielectric material used for subsequently formed devices, e.g., NFET (in NFET area) and PFET (in PFET area) with a common gate electrode but with separate workfunction metals. The dielectric material 16 can be any gate dielectric material, depending on the desired device application and performance. For example, the dielectric material 16 can be a gate dielectric material of high-k material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The dielectric material 16 can be deposited using conventional deposition methods including, e.g., atomic layer deposition (ALD) or CVD processes.

A sacrificial hardmask material 18 is deposited on the dielectric material 16. The sacrificial hardmask material 18 can be TiN, for example. The sacrificial hardmask material 18 can be deposited by any conventional deposition process, e.g., CVD. The sacrificial hardmask material 18 will be a sacrificial cap for subsequent etching of the dielectric material 16, prior to deposition of workfunction metals for the gate structures, e.g., in the NFET and PFET areas. By depositing the sacrificial hardmask material 18 at this stage of processing, unlike conventional structures and processes, subsequently formed active work-function metals for the NFET and/or PFET will not experience additional organic planarization layer (OPL) coat and strip processes, which is known to significantly impact the work-function characteristics and hence disturb desired threshold voltages.

Figure 2:
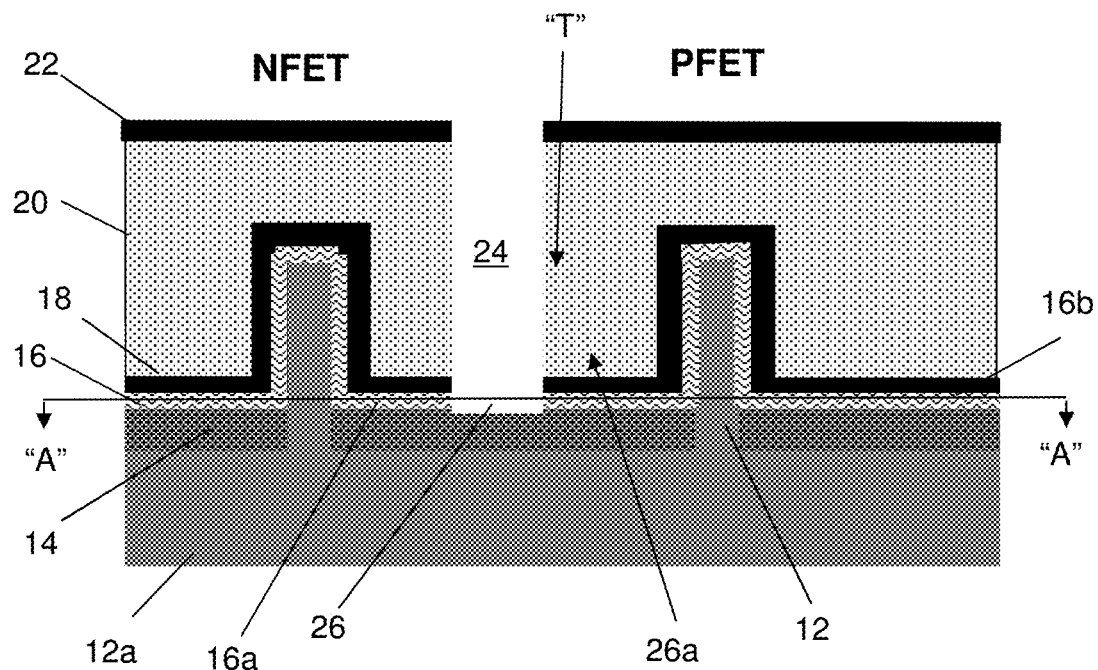
FIG. 2 shows the structure with a cut gate dielectric material, amongst other features, and respective fabrication processes in accordance with aspects of the present disclosure.

In FIG. 2, the dielectric material is cut to form separate gate dielectric materials 16a, 16b for the separate devices, e.g., NFET and PFET. This cut process is performed prior to the deposition of any workfunction metals for the NFET and PFET. Accordingly, by cutting the dielectric material, the NFET and PFET will no longer share a common gate-dielectric material, effectively cutting off the oxygen path from the PFET side to the NFET side.

More specifically, in embodiments, the dielectric material 16 can be cut, e.g., etched, by using conventional CMOS methods. For example, a resist stack comprising material 20, e.g., organic planarization layer (OPL), and hardmask material 22 can be deposited on the hardmask material 18, over the NFET and PFET side of the structure. Through a conventional lithographic process, e.g., by exposure to light, an opening or pattern 24 is formed within the resist material. Following the lithography process, an etching step is performed though the opening to cut into the TiN and dielectric material 16, forming a cut 26 in the dielectric material 16 between the adjacent devices. The cut 26 will effectively separate the dielectric material, e.g., separate gate dielectric materials 16a, 16b, for the separate devices, e.g., NFET and PFET, respectively. In embodiments, the cut 26 can be formed within a trench 26a formed between and by the adjacent fin structures 12.

In embodiments, a TiN etch can include, e.g., $H_2O_2$ based wet chemistries or a dry chemistry, and the etching of the dielectric material 16 can be a gentler $HfO_2$ etch with high selectivity to the insulator material 14, e.g., oxide material, and any interlevel dielectric material and sidewall spacers. The etch chemistry of the dielectric material etch can also be DHF/HCl based wet chemistry or dry etch. In any of these chemistries, the etch process will not significantly affect the insulator material 14. In this way, the cut 26 will be inside the gate of the NFET and the PFET.

Figure 3:
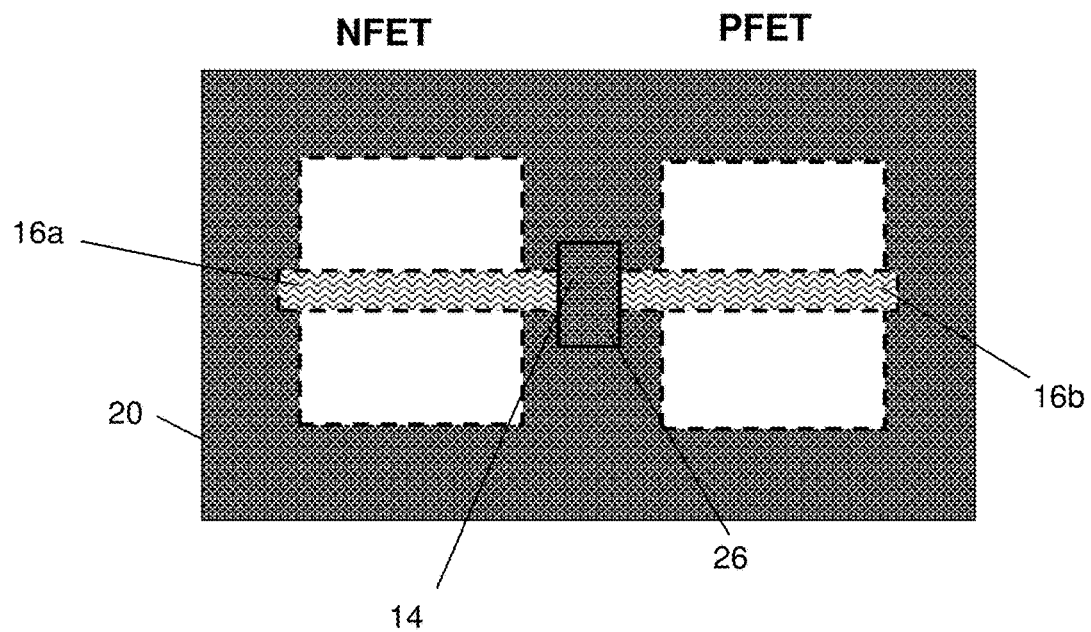
FIG. 3 shows a top down view of the structure of FIG. 2 along line A-A, with a cut through the gate dielectric material, amongst other features.

FIG. 3 shows a top down view of the structure of FIG. 2 along line A-A, with a cut through the gate dielectric material, amongst other features. More specifically, FIG. 3 shows the opening or cut 26 of the cut gate dielectric material 16a, 16b of the NFET and PFET respectively. As shown in FIG. 3, the opening or cut 26 of the cut gate dielectric material 16a, 16b will expose the underlying insulator material 14 between the respective the NFET and PFET.

Figure 4:
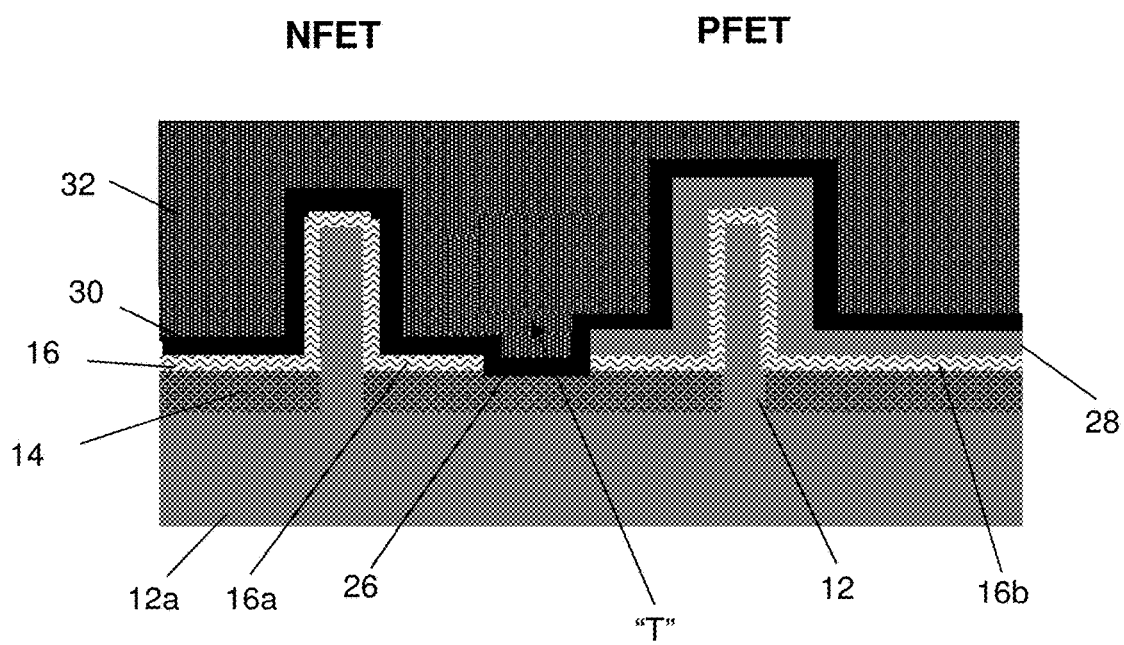
FIG. 4 shows gate metals over the cut gate dielectric material between adjacent devices, amongst other features, and respective fabrication processes in accordance with aspects of the present disclosure.

FIG. 4 shows gate metals 28, 30, 32 covering the cut gate dielectric material 16a, 16b between adjacent devices, e.g., NFET and PFET, and respective fabrication processes. The gate fabrication processes can be, e.g., a replacement gate process as is known in the art. For example, as shown in FIG. 4, the resist stack and sacrificial (TiN) hardmask is removed to expose the final gate dielectric structure. Gate materials 28, 30, 32 are deposited over the fin structures 12 and the final gate dielectric structure, e.g., gate material 16a, 16b, to form both the NFET device and the PFET device. By depositing the gate materials 28, 30, 32 after the gate dielectric cut process, the cut 26 will reside inside of the gates of the NFET and the PFET, e.g., within a trench "T" between the NFET and PFET. In addition, none of the metal gate materials will experience the organic planarization layer (OPL) coat and strip processes, which is known to significantly impact the work-function and affect threshold voltages.

More specifically and still referring to FIG. 4, following the resist removal using conventional stripants, a workfunction metal 28 is deposited and patterned for the PFET device. In embodiments, the workfunction metal 28 can be deposited by any conventional deposition processes, e.g., CVD processes, followed by a conventional patterning process to remove such material on the NFET side of the device. An NFET metal 30 is deposited over the NFET side of the device, in addition to over the workfunction metal 28 of the PFET side of the device. Accordingly, as should be understood by those of skill in the art, the metal 30 (e.g., gate electrode) can be shared by the NFET device and the PFET device, extending directly over the cut 26 formed between such devices. That is, the metal gate material, e.g., metal 30, will sit directly on the insulator material 14, between the NFET device and the PFET device. A gate metal 32 is deposited on the NFET metal 30, used for both the PFET device and the NFET device. The gate metal 32 can be any replacement gate metal used for NFET devices and PFET devices, e.g., tungsten, TiN, etc.

By implementing the processes described herein, it is possible to fabricate different devices, e.g., SRAMs, inverters, etc., with a shared-gate structure. In these implementations, the NPET and the PFET have: (i) a common gate-electrode; (ii) a dielectric material (e.g., high-k dielectric material) inside gate which is not connected between the NFET and the PFET; and (iii) metal gate material sitting directly on insulator material, e.g., isolating dielectric material (e.g., shallow trench isolation (STI)), between the NPET and the PFET. Accordingly, by having a discontinuous dielectric material the diffusion of oxygen from the PFET to the NFET can be eliminated, thereby preserving the Vts of both the PFET and the NFET, and enabling scaled thickness of the workfunction metal and improved Vt control.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    forming a common dielectric material over a first device area and a second device area;
    cutting the common dielectric material within a gate trench between the first device area and the second device area to separate the common dielectric material into a first dielectric material over the first device area and a second dielectric material over the second device area;
    forming a workfunction metal over the first dielectric material in the first device area; and
    forming a common electrode over the workfunction metal of the first device area and the second dielectric material over the second device area to form a first device in the first device area and a second device in the second device area, respectively.

2. The method of claim 1, wherein the cutting of the common dielectric material occurs prior to deposition of the common electrode and deposition of the workfunction metal.

3. The method of claim 1, wherein the cutting of the common dielectric material comprises:
    forming a hardmask material over the common dielectric material;
    forming a resist stack over the hardmask material;
    subjecting the resist stack to a lithography process to form an opening in the resist stack; and
    etching the hardmask material and the common dielectric material through the opening to form the cut in the common dielectric material between the first device area and the second device area.

4. The method of claim 3, wherein the etching of the hardmask and the etching of the common material is performed in separate etching steps with separate etching chemistries.

5. The method of claim 4, further comprising removing remaining portions of the hardmask to expose the first and second dielectric material and depositing the common electrode over the workfunction metal and the first and second dielectric material to form the first device in the first area and the second device in the second device area.

6. The method of claim 5, wherein the first device is a PFET and the second device area is a NFET.

7. The method of claim 6, wherein the common dielectric material is deposited at a same time for the PFET and the NFET, and is cut prior to gate formation processes.

8. The method of claim 1, wherein the common dielectric material is high-k dielectric material.

9. The method of claim 8, wherein the cut removes an oxygen transport conduit from the PFET area to the NFET area.

10. The method of claim 1, wherein the common electrode is deposited to span the first dielectric material over the first device area and the second dielectric material over the second device area.

11. The method of claim 10, wherein the common electrode is deposited directly over the workfunction metal, wherein the common electrode is a NFET metal and the workfunction metal is a PFET material.

12. The method of claim 11, wherein the common electrode is shared for the first device and the second device.

13. The method of claim 11, wherein the common electrode is deposited directly on an insulator material under the common dielectric material.

14. The method of claim 13, further comprising depositing a gate metal directly on the common electrode for both the first device and the second device.

15. The method of claim 14, wherein the gate metal is a replacement gate metal.

* * * * *